United States Patent [19]

Morten et al.

[11] Patent Number: 4,768,736
[45] Date of Patent: Sep. 6, 1988

[54] INFORMATION TRANSMISSION SYSTEM

[75] Inventors: Frank D. Morten, Southampton, United Kingdom; Stuart Forder, Sherfield, England

[73] Assignee: U.S. Philips Corp., New York, N.Y.

[21] Appl. No.: 14,515

[22] Filed: Feb. 13, 1987

[30] Foreign Application Priority Data

Feb. 14, 1986 [GB] United Kingdom ............... 8603682

[51] Int. Cl.[4] .............................................. F41G 7/30
[52] U.S. Cl. .................................. 244/3.11; 244/3.13
[58] Field of Search ........................... 244/3.13, 3.11; 250/200, 215

[56] References Cited

U.S. PATENT DOCUMENTS

| 3,974,383 | 8/1976 | Chapman | 244/3.11 |
| 4,397,430 | 8/1983 | Heidmann et al. | 244/3.16 |
| 4,441,668 | 4/1984 | Menke | 244/3.11 |

FOREIGN PATENT DOCUMENTS 2087185 5/1982 United Kingdom ............... 244/3.12

Primary Examiner—Charles T. Jordan
Attorney, Agent, or Firm—Thomas A. Briody; Jack E. Haken

[57] ABSTRACT

An information transmission system is provided for a guided missile 1 in which guidance information is transmitted from the missile launch point to the missile along a beam 8 of 10 μm wavelength radiation. The missile has a rearwards facing optical system 9 to collect and focus the radiation onto a cooled cadmium mercury telluride detector. The proportion of cadmium to mercury in the detector is chosen so that just after launch in the early stage of detector cool-down the long wavelength cut-off of the detector just includes the 10 μm radiation, providing an early guidance signal, and so that, as cooling proceeds, the long wavelength cut-off moves to longer wavelengths thereby rapidly enhancing the received signal to compensate for loss of received energy at the missile due to missile range increase.

6 Claims, 3 Drawing Sheets ized. The missile comprises a rearwards to longer wavelengths due to cooling will produce a large

INFORMATION TRANSMISSION SYSTEM

TECHNICAL FIELD

The invention relates to an information transmission system for sending information along a beam of radiation of a selected wavelength from a radiation transmitter to a radiation receiver in which the radiation intensity at the receiver falls as a function of time elapsed from a start of information transmission, the receiver comprising a radiation detector whose detectivity rises as a function of falling detector temperature and cooling means for progressively reducing the detector temperature from the start of transmission. Such an information transmission system may be employed in a guided missile system to transmit information from the missile launch point to the missile, while in flight, to guide it to its target.

BACKGROUND ART

Wire-guided anti-tank missiles are known in which an operator observes a target tank using an imaging system, typically a thermal imaging system, and aligns a graticule with the target. The missile is then fired and guided to the target, either by the operator or by an automatic guidance system, by means of guidance signals fed to the missile along a wire which the missile unwinds behind itself and leaves stationary on the ground as it moves toward the target. Such a missile guidance system is described in British Patent Specification No. 2,087,185A.

It has been proposed to replace the wire link by a radiation link comprising a source of radiation at the missile launch point which can be modulated with the guidance information. The radiation is formed into a beam of angular width covering the target and the expected range of lateral movement of the missile on its way to the target. The missile comprises a rearwards facing radiation collection and detection system which receives the modulated radiation from the source and converts it into appropriate guidance signals for the missile flight path control system.

Desirably, the radiation source should produce non-visible radiation for obvious security reasons and should also be infra-red radiation of a sufficiently long wavelength that the radiation can penetrate mist, fog or smoke as much as possible. A typically convenient source of radiation is the carbon dioxide laser which operates at a wavelength of 10.6 $\mu$m. Cooled infra-red detectors are then generally desirable to detect the radiation with adequate sensitivity. Stored electrical energy or compressed gas is then required within the missile to provide detector cooling in a form to be instantly available on firing the missile but to have a long storage life. Unavoidably the stored energy is limited and therefore detector cooling cannot start until the missile is fired and there will be a delay before the detector responds to radiation and while the detector temperature falls to its operating value.

From the instant of firing the distance between the missile and the source increases, growing more rapidly as the missile accelerates under booster rocket power to its cruise velocity. Since the received radiation energy at the missile will fall inversely as the square of missile distance, the received energy will fall rapidly, exacerbating the effect of the delay in detector sensitivity rise.

DISCLOSURE OF THE INVENTION

It is an object of the invention to provide an information transmission system for such a guided missile in which the detector sensitivity, while low at launch, is sufficient to provide guidance signals at short range and in which the detector sensitivity rises with increasing missile range from the launch point.

The invention provides an information transmission system for sending information along a beam of radiation of a selected wavelength from a radiation transmitter to a radiation receiver in which the radiation intensity at the receiver falls as a function of time elapsed from a start of information transmission, the receiver comprising a radiation detector whose detectivity rises as a function of falling detector temperature and cooling means for progressively reducing the detector temperature from the start of transmission characterised in that the detector is a semiconductor detector having a peak in detectivity as a function of wavelength, and in that the peak increases in wavelength from less than the selected wavelength up to at least the selected wavelength as the detector temperature falls towards its operating value. The invention thereby provides a large rise in detectivity as the detector cools. This is due partly to the fact that the curves of detectivity as a function of wavelength are steep on the long wavelength side of the peak, that is, towards the cut-off wavelength. Thus a bodily shift of the whole curve to longer wavelengths due to cooling will produce a large change in detectivity at a fixed wavelength selected just at or beyond cut-off at high temperature. The rise in detectivity is also assisted by the rise in detectivity at all wavelengths as a function of falling temperature. The detectivity curve at a high temperature lies entirely beneath the detectivity curve at a low temperature.

An embodiment of the invention will now be described by way of example with reference to the accompanying drawings in which,

PREFERRED EMBODIMENT FOR CARRYING OUT THE INVENTION

Figure 1:
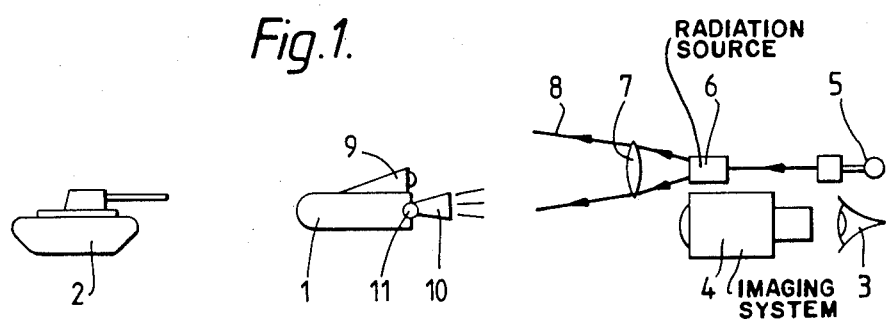
FIG. 1 shows a missile guidance system in schematic form.

Referring to FIG. 1, a missile guidance system is shown schematically to illustrate the guidance of a missile 1 towards a target 2, the missile being shown in mid-course. At the missile launch point an operator 3 views the missile and target using an imaging system 4 which comprises means for forming an enlarged image of the missile and target and for injecting an aiming graticule into the enlarged image to assist the operator. Depending on the degree of misalignment between the missile flight path and the target, the operator makes manual adjustments to a joystick 5 to generate correction signals which are applied to modulate a radiation source 6 comprising a carbon dioxide laser emitting radiation at 10.6 μm wavelength. An objective system 7 forms a radiation beam 8 from the radiation emitted by the source. The beam is arranged to have an angular spread sufficient to cover the expected range of lateral movement of the missile 1 on its path to the target 2. The missile comprises a rearwards facing radiation collection and detection system 9 which receives the beam 8 and decodes the missile guidance signals from it. The guidance signals are applied to means to alter the missile flight path. In this case the rocket propulsion motor 10 is mounted in gimbals 11 so that the direction of rocket thrust relative to the missile body can be altered to effect changes in missile movement direction. The guidance signals are applied to gimbal rotation devices not shown.

Figure 2:
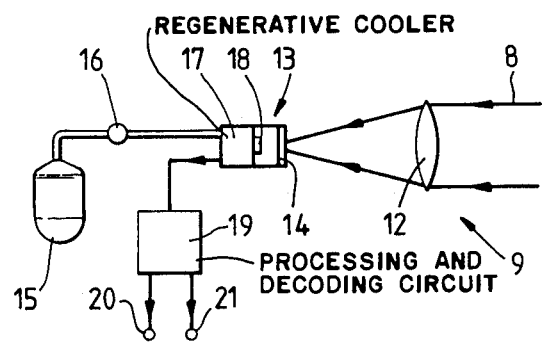
FIG. 2 shows the radiation collection and detection system on the missile of FIG. 1, FIGS. 3 and 4 show curves of the variation of detector detectivity with wavelength at various values of detector temperature.

The radiation collection and detection system 9 is shown schematically in FIG. 2. An objective lens 12 focusses the incoming radiation 8 onto a radiation detection assembly 13. The assembly comprises an input window 14, an infra-red detector 18 mounted upon a substrate, and means for cooling the substrate and detector. The cooling means comprises a reservoir 15 of highly compressed nitrogen or argon gas (100 atmospheres), and a valve 16 for controlling the flow of gas to a regenerative cooler 17 shown schematically. The final operating value of detector temperature reached is 77° K. or 89° K. respectively. The initial rate of cooling is very rapid, a temperature of 150° K. being reached in 0.6 seconds. The detector output signal is passed to processing and decoding circuit 19 which produces an up/down guidance signal at output 20 and a left/right guidance signal at output 21 for the gimbal rotation devices.

Figure 3:
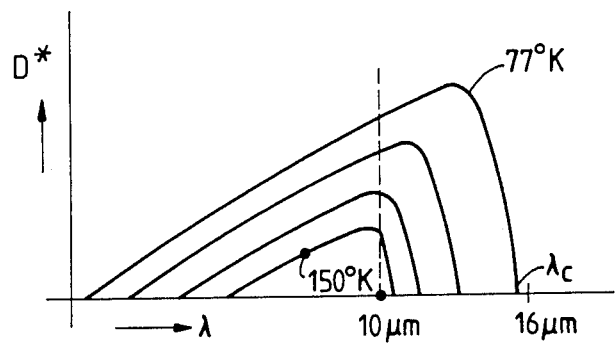

The detector 18 is a photoconductive cadmium mercury telluride (CMT) semiconductor detector. In practical detectors the ratio of cadmium (Cd) to mercury (Hg) can be varied to produce detectors having different properties, the general formula of the compund being given as $Hg_{1-x}Cd_xTe$, the variable x giving the relative proportions of Cd to Hg. A second independent variable which can be chosen to modify the detector properties is the temperature at which the detector is operated. FIG. 3 shows the variation of detectivity, $D^*$, as a function of the wavelengh, $\lambda$, of the radiation being received. $D^*$ effectively gives the signal to noise ratio achieved in the detector output for unit radiation power received at a specified wavelength, the signal being confined to unit bandwidth. Thus, assuming adequate signal amplification is subsequently available, $D^*$ gives the detector sensitivity for useful signal output.

Figure 4:
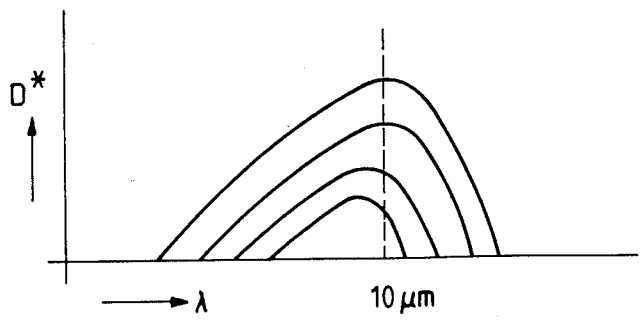

FIG. 3 shows the variation of $D^*$ as a function of $\lambda$ for four values of temperature T° K. in a CMT detector with a particular value of x. $D^*$ rises as temperature falls and, importantly, the long wavelength cut-off $\lambda_c$ of detectivity moves to longer wavelengths. In this case $\lambda_c$ rises from 10 μm at 150° K. to 16 μm at 77° K. FIG. 4 shows the same information as FIG. 3 but for a detector of a different value of x. It is to be noted that the fall in $D^*$ after the peak toward $\lambda_c$ is steeper than the rise in $D^*$ with $\lambda$ below the peak. The effect of variation of x on the value of $\lambda_c$ as a function of temperature is summarised in FIG. 5 which is given in an article by J. L. Schmit in Journal of Applied Physics Volume 41 No. 7 on page 2877. From FIG. 5 it will be seen that lower values of x give a greater shift of $\lambda_c$ to longer wavelengths as a function of falling temperature. Thus a value of x can be chosen in relation to a wavelength that has been selected for the source 6 of FIG. 1, in relation to the known fall of temperature with time produced by the cooling device and in relation to the known increase in missile range from the launch point so that a small but adequate detectivity is available very shortly after launch followed by a marked increase of detectivity as the missile range increases.

It is to be noted that the effect of the inverse square law fall in received energy as a function of missile range is to produce much larger percentage reductions in received energy for a given change in range at short ranges than does the same change in range at long ranges. Thus large increases in detector sensitivity are desirable during the early stages of guidance for it is then that the greatest percentage reductions in received energy occur. As will be seen it is the selection of wavelength of the radiation source in relation to the choice of shape and position of the detectivity curve of the detector in accordance with the invention which achieves this rise of detectivity at the right time during the missile flight.

Figure 5:
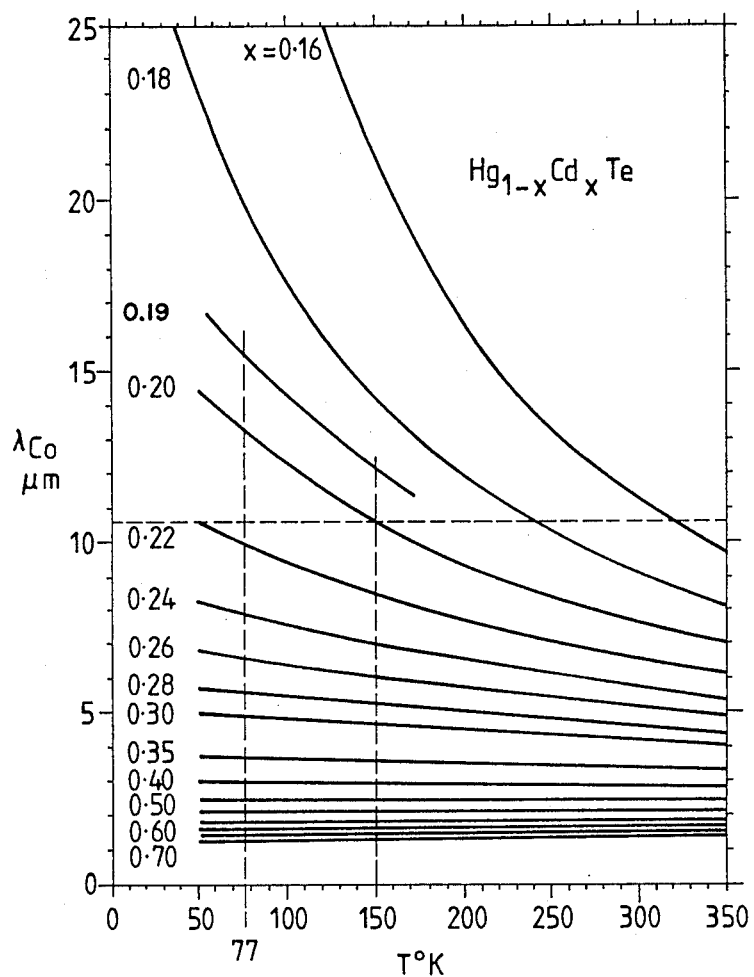
FIG. 5 shows the variation of long wavelength cut-off in a cadmium mercury telluride detector with detector temperature for various values of the proportion of cadmium to mercury in the detector.

In FIGS. 3 and 4 are selected wavelength of 10 μm is shown, close to the carbon dioxide laser wavelength of 10.6 μm. In the cooling example quoted, 0.6 second after launch when T=150° K. $\lambda_c$ has risen so that $D^*$ has a useful value at 10.6 μm, this wavelength then lying just inside the $D^*$ curve for 150° K. Further fall of detector temperature not only produces further shift of $\lambda_c$ to longer wavelengths but also increases the peak $D^*$. The peak $D^*$ also shifts to longer wavelengths. In FIG. 4 the shift of peak $D^*$ is not so great. From FIG. 5 it will be seen that values of x can be chosen, from about x=0.35 upwards so that there is very little change in $\lambda_c$. In FIG. 5, it will be seen that a value of x between 0.20 and 0.19 can be chosen so that at 150° K. $\lambda_c$ is just at or above 10.6 μm and thereafter shifts to 16 μm at a temperature of 77° K. corresponding to the FIG. 3 situation.

The invention has been described so far in relation to a particular ternary compound, CMT. Other ternary compounds could be used. Lead tin telluride for example might be employed provided its high coefficient of thermal expansion, 10 ppm/°C., is acceptable. CMT has a lower thermal expansion and can be grown epitaxially on cadmium telluride, sapphire or gallium arsenide. Quaternary compounds may also be used for the detector. In particular, CMT may be used in which a small part of the tellurium is replaced by selenium. This achieves a beter lattice match when growing the detector epitaxially and hence produces a smaller number of dislocations in the detector.

We claim:

1. An information transmission system for sending information along a beam of radiation of a selected wavelength comprising: a radiation transmitter and a radiation receiver, the information transmission system sending the information from the radiation transmitter to the radiation receiver, the radiation intensity at the radiation receiver falling as a function of time elapsed from a start of information transmission, the radiation receiver including a radiation detector whose detectivity rises as a function of falling detector temperature and cooling means for progressively reducing the detector temperature from the start of transmission, the detector having a peak in detectivity as a function of wavelength, which peak increases in wavelength from less than the selected wavelength up to at least the selected wavelength as the detector temperature falls towards its operating value.

2. An information transmission system as claimed in claim 1, wherein the peak in detectivity at the operating temperature is at a wavelength longer than the selected wavelength.

3. An information transmission system as defined in claim 2, wherein the detector is a cadmium mercury telluride photoconductive detector, and the relative proportions of cadmium and mercury are selected so that the long wavelength cut-off of the detector substantially equals the selected wavelength before cooling.

4. An information transmission system as claimed in claims 1, 2 or 3, wherein the selected wavelength is 10.6 $\mu$m.

5. An information transmission system as claimed in claims 1, 2 or 3, wherein the receiver recedes from the transmitter as a function of time from the start of transmission, producing the fall in received radiation intensity.

6. An information transmission system as claimed in claim 5 wherein the receiver is mounted in a guided missile, the start of transmission is the launch instant of the missile, and the information transmitted is missile guidance information.

* * * * *